United States Patent [19]

Martin et al.

[11] Patent Number: 5,683,917
[45] Date of Patent: Nov. 4, 1997

[54] METHOD OF MAKING A LOW NOISE SEMICONDUCTOR DEVICE COMPRISING A SCREENING MEASUREMENT

[75] Inventors: Samuel Suresh Martin, Gillette; Ralph Francis Trambarulo, Red Bank; Cuong Tran, Howell, all of N.J.

[73] Assignee: Lucent Technologies, Murray Hill, N.J.

[21] Appl. No.: 674,956

[22] Filed: Jul. 3, 1996

[51] Int. Cl.$^6$ ............................................. H01L 21/66
[52] U.S. Cl. ............................................. 437/8; 437/226
[58] Field of Search ............................ 437/7, 8, 39, 226, 437/227, 904; 148/DIG. 162

[56] References Cited

U.S. PATENT DOCUMENTS

| | | | |
|---|---|---|---|
| 5,032,786 | 7/1991 | Kimura | 437/8 |
| 5,399,505 | 3/1995 | Dasse et al. | 437/226 |
| 5,489,538 | 2/1996 | Rostoker et al. | 437/226 |

*Primary Examiner*—Chandra Chaudhari
*Attorney, Agent, or Firm*—Eugen E. Pacher

[57] ABSTRACT

The disclosed method of making a semiconductor device comprises a screening procedure that facilitates identification of devices having relatively low flicker noise. The devices are typically semiconductor diodes. The procedure utilizes our discovery of a correlation between the reverse bias current $I_r$ of a semiconductor device and the flicker noise power, and comprises measurement of the reverse bias current and comparison of the measured value with a predetermined comparison value $I_{rc}$. Devices having $I_r \leq I_{rc}$ are those that have relatively low flicker noise. The screening procedure is simple and quick, and can be readily performed in a manufacturing environment.

9 Claims, 2 Drawing Sheets

5,683,917

METHOD OF MAKING A LOW NOISE SEMICONDUCTOR DEVICE COMPRISING A SCREENING MEASUREMENT

FIELD OF THE INVENTION

This invention pertains to methods of making low noise semiconductor devices that comprise a semiconductor junction, wherein the method comprises a screening measurement, and sorting of the devices in accordance with the results of the screening measurements.

BACKGROUND OF THE INVENTION

Semiconductor devices that comprise a semiconductor junction include bipolar transistors as well as diodes. Such devices have widespread use, and the processes for making the devices have reached a high state of development. Nevertheless, it is frequently necessary or desirable to make measurements on all or a sample of the devices, to be able to identify (and typically remove) devices that do not meet predetermined specifications. Desirably, the measurements are made at the earliest possible point in the manufacturing process, and are of a type that can be carried out in a manufacturing environment. For instance, diodes and other semiconductor junction devices (herein collectively "diodes") typically produce noise, including very low frequency noise referred to as "flicker" noise, and devices that produce more than a predetermined amount of flicker noise power are not acceptable as, e.g., RF detectors.

The direct measurement of flicker noise power in such diodes is typically time consuming and thus expensive. It also poses stringent requirements on the measurement environment, and typically cannot be made in a manufacturing environment. Thus, an indirect method of identifying those diodes that are likely to exhibit more than a predetermined amount of flicker noise power would be highly desirable, especially if the indirect method is not time consuming and can be carried out in a manufacturing environment. This application discloses such an indirect method, and a manufacturing process that comprises measurements according to the method.

Glossary

The term "semiconductor device" herein refers not only to a functional unit on a semiconductor wafer but also to the same functional unit on a semiconductor chip after dicing of the wafer into chips, and also to the same functional unit in a package after packaging of the chip. The "functional unit" will frequently be a semiconductor diode but can also be a transistor or IC.

THE INVENTION

Figure 1:
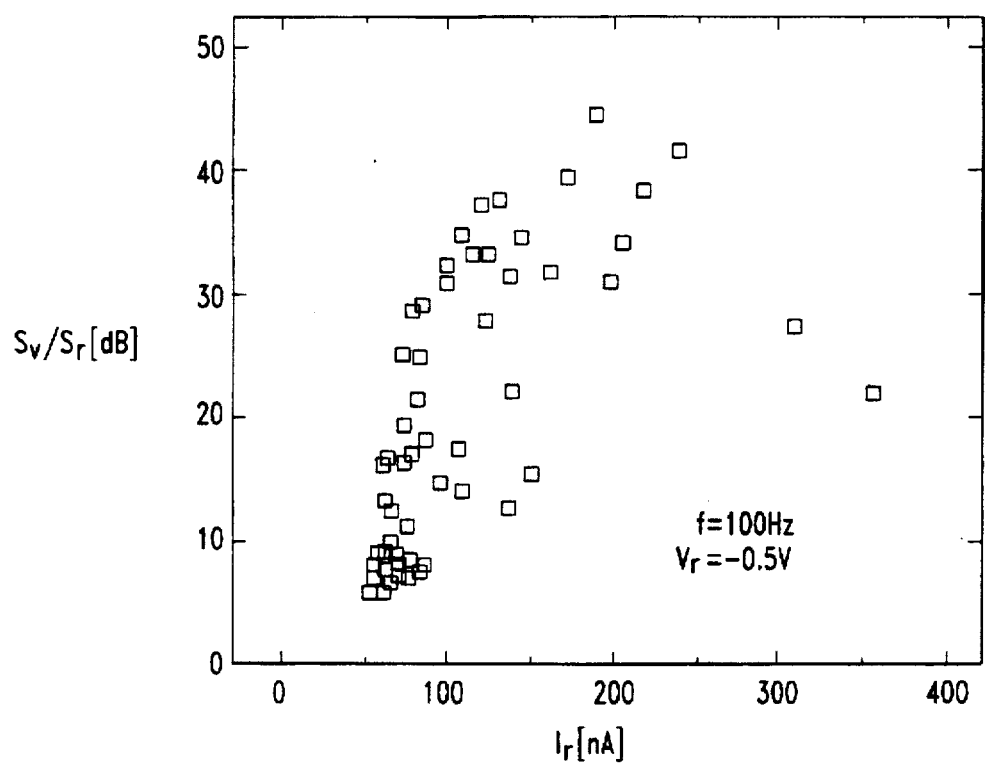
FIG. 1 shows exemplary data on normalized flicker noise power of commercially available Schottky diodes versus reverse bias current.

In a broad aspect the invention is embodied in a method of making a semiconductor device that comprises a semiconductor junction and has, under normal operating conditions, at most a predetermined amount of flicker noise power. The method will be described in terms of an exemplary embodiment, namely, a method of making Schottky diodes, but is believed not to be limited to Schottky and other semiconductor diodes.

More specifically, the method comprises providing a semiconductor body (typically a processed wafer) that comprises a multiplicity of semiconductor devices, e.g., diodes. The semiconductor body is conventional, and can be produced by any appropriate manufacturing process. The method also comprises dividing the semiconductor body into a multiplicity of semiconductor chips, and packaging at least some of the chips. Dividing and packaging can also be conventional.

Significantly, the method comprises a screening procedure for identifying semiconductor devices having relatively low noise. The screening procedure comprises measuring a reverse bias current $I_r$ across a semiconductor junction of a given semiconductor device, and comparing $I_r$ to a predetermined comparison value $I_{rc}$. The given semiconductor device has relatively low noise if $I_r \leq I_{rc}$.

Exemplarily, the method comprises applying, after provision of the processed semiconductor wafer (typically prior to dividing of the wafer), to at least one (typically many, optionally all) of the semiconductor devices a reverse bias $V_r$, such that a reverse current $I_r$ flows across the semiconductor junction. The method also comprises comparing $I_r$ of a given device to a predetermined comparison value $I_{rc}$, and treating the given device according to the outcome of the comparison.

By "treating a given device according to the outcome of the comparison" we mean any kind of subsequent action that depends on the measured value of $I_r$. Typically the measured value of $I_r$ is the value measured on the given device. However, this is not necessarily the case. For instance, a sample of the devices on a wafer can be measured, and all of the devices on the wafer can be passed or rejected, depending on the values of $I_r$ of the sample. Clearly, a wide spectrum of actions can be taken, depending on requirements and the preferences of those skilled in the art. All such actions are facilitated by our discovery of a correlation between $I_r$ and flicker noise, and are contemplated. For instance, it is possible to mark all devices that have $I_r \leq I_{rc}$, but to otherwise treat all devices the same.

Exemplarily the method involves rejection of a given device (e.g., if $I_r > I_{rc}$), acceptance of the device for use as a low flicker noise device (e.g., if $I_r \leq I_{rc}$), or possibly acceptance of the device for applications that are more tolerant of flicker noise (e.g., if $I_r > I_{rc}$ but $I_r \leq I'_{rc}$, where $I'_{rc}$ is a second predetermined comparison value that is greater than $I_{rc}$).

It is known that flicker noise in diodes is caused primarily by generation and recombination of carriers due to defects at the semiconductor junction. See, for instance, A. van der Ziel, "Noise in Measurements", Wiley, N.Y. 1976, especially pages 77 to 87. It is also known that low frequency (flicker) noise is typically associated with higher frequency phase noise.

We have performed direct flicker noise measurements on commercially available semiconductor diodes. These measurements were relatively time consuming, and had to be carried out under conditions (e.g., RF shielding) that would be difficult to attain in a manufacturing environment. We have also measured the reverse bias current $I_r$ of the same semiconductor diodes, and found that the reverse bias current of a given device at least qualitatively reflects the flicker noise performance of the device. That is to say, we have discovered a correlation between flicker noise performance and reverse bias current of semiconductor diodes. The reverse bias current can be measured easily and quickly in a manufacturing environment. Consequently, measurement of the reverse bias current constitutes a convenient technique for screening for compliance with a given flicker noise specification.

Those skilled in the art will understand that it is typically a simple matter to determine an appropriate value of Irc for any given semiconductor device and application. Typically the maximum acceptable flicker noise power is a specification provided by, e.g., the designers of the circuit or system that will comprise the device. Measurement of flicker noise power and reverse bias current of a batch (e.g., about hundred) of the devices can yield data that will at least qualitatively be substantially like that of FIG. 1, and that permits identification of an appropriate value of $I_{rc}$.

FIG. 1 shows exemplary results of normalized flicker noise power (at 100 Hz) versus $I_r$ for a batch of commercially available n-type Schottky diodes. The flicker noise power $S_v$ was measured at a forward bias current of 2.5 µA, and was normalized to the measured thermal noise power $S_r$ of a 10kΩ resistor in the measurement setup. $I_r$ was measured at 0.5 V reverse bias.

Figure 2:
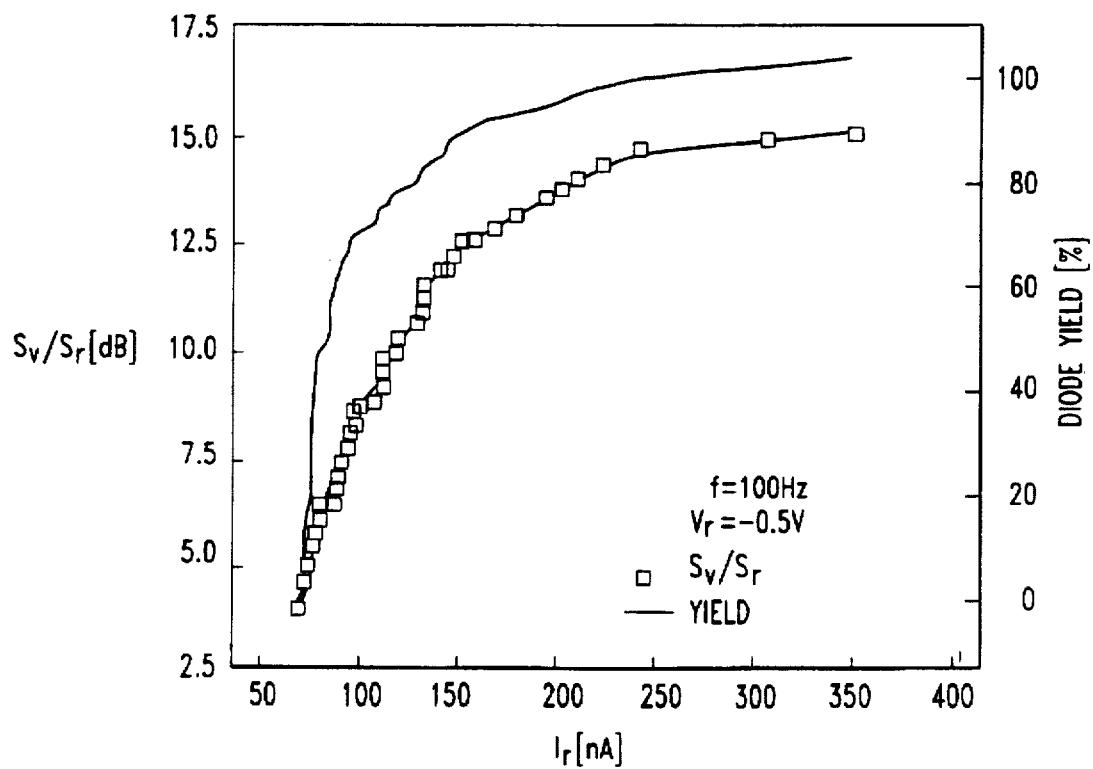
FIG. 2 shows that data of FIG. 1 presented in terms of mean normalized noise power of all diodes of FIG. 1 with $I_r$ less than the abscissa value, as well as a curve of yield vs. reverse bias current.

FIG. 2 shows a plot of the data of FIG. 1 in terms of the mean normalized noise power of all diodes of the batch with $I_r$ less than the abscissa value. The results indicate a direct correlation between $I_r$ and the mean normalized flicker noise power of the diodes. FIG. 2 also shows the device yield versus $I_r$, enabling estimation of diode yield for a given noise specification.

Figure 3:
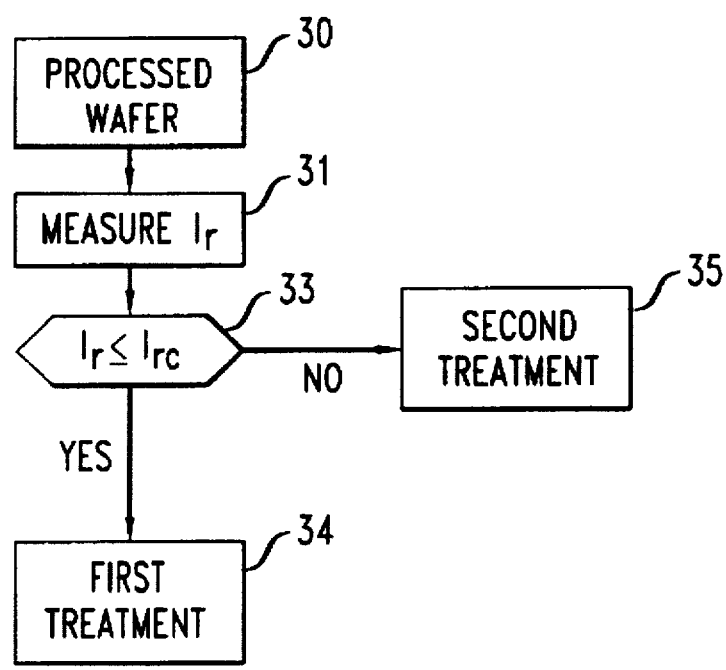
FIG. 3 presents in block diagram form an exemplary embodiment of the inventive process.

FIG. 3 shows in block diagram form an exemplary embodiment of the inventive method, wherein block 30 refers to the provision of a conventially processed semiconductor wafer with a multiplicity of semiconductor devices, e.g., semiconductor diodes. Block 31 refers to the measurement of $I_r$ of some or all of the semiconductor devices of the wafer. Such measurements are well known, and can be readily performed with commercially available (typically computer controlled) equipment. Decision block 33 refers to comparing the measured values of $I_r$ to the predetermined comparison value $I_{rc}$ that exemplarily corresponds to the highest acceptable value of flicker noise power. In actual practice the comparison need not be carried out as a separate step after measurement of all $I_r$, but will frequently be made concurrently with the current measurement for each given semiconductor device, with the result of the comparison stored in computer memory for each given device, such that, after dicing of the wafer, the appropriate semiconductor chips can be retained or rejected, as the case may be, or the device can be marked in accordance with the result of the comparison. Blocks 34 and 35 broadly refer to a first and second treatment, respectively, exemplarily completion of making the packaged device and rejection of the device, respectively.

The results of the comparisons are not necessarily limited to simple retain/reject decisions, but can also be used as a basis for dividing retained devices into two or more classes that differ with regard to their flicker noise behavior.

Although the screening measurements (and associated comparisons and decisions) will usually be made at the wafer stage, before dicing of the wafer into individual semiconductor chips, the measurements can also be carried out after dicing, or even after packaging. Indeed, the measurement is not necessarily part of the fabrication process but could be performed by a user of the devices, e.g., to determine suitability of devices for their intended purpose.

The invention claimed is:

1. Method of making semiconductor devices comprising a) providing a semiconductor body comprising a multiplicity of semiconductor devices;

b) dividing the semiconductor body into a multiplicity of semiconductor chips, with a chip comprising a semiconductor device; and c) packaging at least some of the semiconductor chips;

CHARACTERIZED IN THAT the method comprises a screening procedure for identifying semiconductor devices having relatively low noise, said screening procedure comprising measuring a reverse bias current $I_r$ across a semiconductor junction of a given semiconductor device, and comparing $I_r$ to a predetermined comparison value $I_{rc}$, with the given semiconductor device having relatively low noise if $I_r \leq I_{rc}$.

2. Method according to claim 1, wherein the semiconductor device is a semiconductor diode.

3. Method according to claim 1, wherein measuring $I_r$ comprises applying a reverse bias across the semiconductor junction.

4. Method according to claim 1, wherein $I_{rc}$ is determined by a procedure that comprises measuring a flicker noise power and $I_r$ of a plurality of said semiconductor devices.

5. Method according to claim 1, wherein the method comprising measuring $I_r$ of substantially all semiconductor devices of said semiconductor body.

6. Method according to claim 1, wherein the method comprises measuring $I_r$ of some but not all of the semiconductor devices of said semiconductor body.

7. Method according to claim 1, further comprising treating a given semiconductor device in accordance with the outcome of the comparing step.

8. Method according to claim 7, wherein said treating comprises rejection of a semiconductor device having $I_r > I_{rc}$.

9. Method according to claim 7, wherein said treating comprises acceptance for further processing of a semiconductor device having $I_r \leq I_{rc}$.

* * * * *